(12) United States Patent
McWhirter et al.

(10) Patent No.: US 9,559,023 B2
(45) Date of Patent: Jan. 31, 2017

(54) SYSTEMS AND METHODS FOR REDUCING BEAM INSTABILITY IN LASER ANNEALING

(71) Applicant: Ultratech, Inc., San Jose, CA (US)

(72) Inventors: James T. McWhirter, San Jose, CA (US); Andrew Hawryluk, Los Altos, CA (US); Serguei Anikitichev, Hayward, CA (US); Masoud Safa, Cupertino, CA (US)

(73) Assignee: Ultratech, Inc., San Jose, CA (US)

( * ) Notice: Subject to any disclaimer, the term of this patent is extended or adjusted under 35 U.S.C. 154(b) by 75 days.

(21) Appl. No.: 14/311,747

(22) Filed: Jun. 23, 2014

(65) Prior Publication Data

US 2015/0371911 A1    Dec. 24, 2015

(51) Int. Cl.
*H01L 21/26* (2006.01)
*H01L 21/66* (2006.01)
*H01L 21/324* (2006.01)
*B23K 26/00* (2014.01)
*B23K 26/03* (2006.01)
*H01L 21/268* (2006.01)
*H01L 21/67* (2006.01)

(52) U.S. Cl.
CPC .......... *H01L 22/26* (2013.01); *B23K 26/0042* (2013.01); *B23K 26/034* (2013.01); *H01L 21/268* (2013.01); *H01L 21/324* (2013.01); *H01L 22/10* (2013.01); *H01L 21/67115* (2013.01); *H01L 21/67248* (2013.01)

(58) Field of Classification Search
CPC ...... H01L 22/26; H01L 21/268; H01L 21/324; H01L 21/67115; H01L 21/67248
USPC ......................................................... 438/16
See application file for complete search history.

(56) References Cited

U.S. PATENT DOCUMENTS

| 5,003,567 A | 3/1991 | Hawryluk et al. |
| 6,531,681 B1 | 3/2003 | Markle et al. |
| 6,747,245 B2 | 6/2004 | Talwar et al. |
| 6,791,060 B2 | 9/2004 | Dunsky et al. |

(Continued)

FOREIGN PATENT DOCUMENTS

JP    H07-134069 A    5/1995

OTHER PUBLICATIONS

Office Action issued by Japanese Patent Office on Jul. 20, 2016 for Japanese Patent Application No. 2015-115495, which is a counterpart application to the above-identified Application.

*Primary Examiner* — Whitney T Moore
*Assistant Examiner* — Joseph Galvin, III
(74) *Attorney, Agent, or Firm* — Opticus IP Law PLLC

(57) ABSTRACT

Systems and methods for reducing beam instability in laser annealing are disclosed. The method includes: directing a conditioned laser beam through an opening in an aperture using a beam-redirecting element; forming a line image on the surface of the semiconductor wafer by imaging the aperture onto the surface, thereby locally heating the surface to form an annealing temperature distribution; detecting a thermal emission from the locally heated wafer surface; determining the annealing temperature distribution from the detected thermal emission; determining from the annealing temperature distribution a line-image intensity profile that includes a time-varying amount of slope; and adjusting the beam-redirecting element to redirect the laser beam to reduce or eliminate the time-varying amount of slope in the line-image intensity profile.

23 Claims, 7 Drawing Sheets

(56) References Cited

U.S. PATENT DOCUMENTS

| | | | |
|---|---|---|---|
| 6,861,614 B1 | 3/2005 | Tanabe et al. | |
| 7,098,155 B2 | 8/2006 | Talwar et al. | |
| 7,154,066 B2 | 12/2006 | Talwar et al. | |
| 7,157,660 B2 | 1/2007 | Talwar et al. | |
| 7,312,418 B2 | 12/2007 | Tanabe et al. | |
| 7,399,945 B2 | 7/2008 | Talwar et al. | |
| 7,403,284 B2 | 7/2008 | Grek et al. | |
| 7,514,305 B1 | 4/2009 | Hawryluk et al. | |
| 7,763,828 B2 | 7/2010 | Talwar et al. | |
| 7,847,213 B1 | 12/2010 | Anikitchev | |
| 8,014,427 B1* | 9/2011 | Anikitchev | B23K 26/0643 372/9 |
| 8,026,519 B1* | 9/2011 | Anikitchev | B23K 26/0066 257/59 |
| 8,153,930 B1 | 4/2012 | Hawryluk et al. | |
| 8,309,474 B1 | 11/2012 | Wang et al. | |
| 8,337,618 B2 | 12/2012 | Kwon et al. | |
| 8,546,805 B2 | 10/2013 | Shen et al. | |
| 8,691,598 B1 | 4/2014 | Mcwhirter et al. | |
| 8,742,286 B1 | 6/2014 | Hawryluk et al. | |
| 2003/0021307 A1* | 1/2003 | Yamazaki | B23K 26/0604 372/24 |
| 2003/0213787 A1* | 11/2003 | Dunsky | B23K 26/0732 219/121.75 |
| 2004/0084427 A1 | 5/2004 | Talwar et al. | |
| 2004/0173585 A1 | 9/2004 | Talwar et al. | |
| 2004/0188396 A1 | 9/2004 | Talwar et al. | |
| 2005/0067384 A1 | 3/2005 | Talwar et al. | |
| 2005/0103998 A1* | 5/2005 | Talwar | B23K 26/0604 250/340 |
| 2005/0109743 A1 | 5/2005 | Tanabe et al. | |
| 2006/0091120 A1 | 5/2006 | Markle | |
| 2007/0051708 A1 | 3/2007 | Talwar et al. | |
| 2007/0065076 A1 | 3/2007 | Grek et al. | |
| 2007/0166945 A1 | 7/2007 | Tanabe et al. | |
| 2010/0084744 A1 | 4/2010 | Zafiropoulo et al. | |
| 2011/0298093 A1 | 12/2011 | Zafiropoulo et al. | |
| 2012/0111838 A1 | 5/2012 | Zafiropoulo et al. | |
| 2013/0330844 A1 | 12/2013 | Hawryluk et al. | |

* cited by examiner

SYSTEMS AND METHODS FOR REDUCING BEAM INSTABILITY IN LASER ANNEALING

FIELD

The present disclosure relates to laser annealing, and in particular relates to systems and methods for reducing beam instability in laser annealing.

The entire disclosure of any publication or patent document mentioned herein is incorporated by reference, including U.S. Pat. Nos. 6,747,245; 7,098,155; 7,157,660; 7,763,828; 8,014,427; 8,026,519; 8,309,474; 8,501,638; 8,546,805; 8,691,598 and U.S Publication No. 2013/0330844.

BACKGROUND

Laser annealing (also called laser spike annealing, laser thermal annealing, laser thermal processing, etc.) is used in semiconductor manufacturing for a variety of applications, including for activating dopants in select regions of devices (structures) formed in a semiconductor wafer when forming active microcircuits such as transistors and related types of semiconductor features.

One type of laser annealing involves the formation of a line-shaped intensity profile that is scanned over the wafer by moving the line image, moving the wafer, or a combination of these two movements. The line image is scanned in a "scan direction," which is perpendicular to its long axis. Some spatial variation in the intensity in the line image along the scan direction (i.e., the short axis of the line image) can be tolerated since the non-uniformities are averaged out as the line image moves over the wafer. On the other hand, the spatial variation of the intensity profile in the "cross-scan" direction of the line image needs to be tightly controlled to achieve consistent annealing results over the scan path of the line image.

One approach to defining the length of a line image involves passing light through an aperture defined by opposing knife edges. The light passing through the aperture is then imaged by a relay optical system to the wafer. In this type of line-imaging optical system, it has been observed that the intensity profile of the line image in the long direction undergoes time-varying changes. In many cases the changes manifest as a "tilt" (i.e., change in slope) in the intensity profile, and over time this tilt may shift, with the profile slope varying in time and even changing sign (e.g., the slope may change from positive to negative). This type of beam profile instability is also referred to as "beam wobble." This phenomenon can reduce the uniformity of the laser annealing process.

SUMMARY

An aspect of the disclosure is a method of forming a line image during laser annealing of a surface of a semiconductor wafer. The method includes: directing a conditioned laser beam through an opening in an aperture using a beam-redirecting element; forming a line image on the surface of the semiconductor wafer by imaging the aperture onto the surface, thereby locally heating the surface to form an annealing temperature distribution; detecting a thermal emission from the locally heated wafer surface; determining the annealing temperature distribution from the detected thermal emission; determining from the annealing temperature distribution a line-image intensity profile that includes a time-varying amount of slope; and adjusting the beam-redirecting element to redirect the laser beam to reduce or eliminate the time-varying amount of slope in the line-image intensity profile.

Another aspect of the disclosure is a laser annealing system for annealing the surface of a wafer and that reduces or substantially eliminates beam instability in a line image formed at the wafer surface, comprising in order along an optical axis: a laser system that emits a laser beam; a beam-conditioning system that receives the laser beam and forms a conditioned laser beam; a beam-redirecting element configured to receive and selectively redirect the conditioned laser beam in response to a control signal; an aperture that defines an opening through which different portions of the conditioned laser beam pass depending on the redirection of the conditioned laser beam by the beam-redirecting element; a relay system operably arranged between the aperture and the wafer and configured to image the aperture at the wafer surface to form the line image, wherein the line image locally heats the wafer surface to form an annealing temperature distribution; a thermal emission detector arranged to detect a thermal emission from the locally heated wafer surface and generate a thermal emission signal representative of the thermal emission; and a controller operably connected to the beam-deflecting element and the thermal emission detector, the controller being configured to receive the thermal emission signal and calculate therefrom a line-image intensity having a time-varying slope and to provide the control signal to the beam-redirecting element to cause the beam-redirecting element to redirect the conditioned laser beam relative to the aperture to reduce or substantially eliminate the time-varying slope of the line-image intensity.

Another aspect of the disclosure is a method of reducing a time-varying change of an intensity profile of a line image formed during laser annealing of a surface of a semiconductor wafer. The method includes: a) directing a conditioned laser beam to a beam-redirecting element so that the conditioned laser beam passes through an opening defined by an aperture; b) forming a line image on the surface of the semiconductor wafer by imaging the aperture on the wafer surface, thereby locally heating the surface to form a time-varying annealing temperature distribution; c) detecting a time-varying integrated thermal emission over a wavelength band from the locally heated wafer surface; d) determining the time-varying annealing temperature distribution from the detected time-varying integrated thermal emission; e) determining from the time-varying annealing temperature distribution the time-varying change in the line-image intensity profile; and f) adjusting a beam-redirecting element to redirect the conditioned laser beam relative to the opening in the aperture to reduce or eliminate the time-varying change of the line-image intensity profile.

Another aspect of the disclosure is a laser annealing system for annealing the surface of a wafer and that reduces or substantially eliminates beam instability in a line image formed at the wafer surface, comprising in order along an optical axis: a laser system that emits a laser beam; a beam-conditioning system that receives the laser beam and forms a conditioned laser beam; a beam-redirecting element configured to receive and selectively redirect the conditioned laser beam in response to a control signal; a knife-edge aperture that defines an opening through which different portions of the conditioned laser beam pass depending on the redirection of the conditioned laser beam by the beam-redirecting element; a relay system operably arranged between the knife-edge aperture and the wafer and configured to image the knife-edge aperture at the wafer surface to form the line image, wherein the line image locally heats the wafer surface to form an annealing temperature distribution; a thermal emission detector arranged to detect a thermal emission from the locally heated wafer surface and generate a thermal emission signal representative of the thermal emission; and a controller operably connected to the beam-deflecting element and the thermal emission detector, the controller being configured to receive the thermal emission signal and calculate therefrom a line-image intensity having a time-varying change and to provide the control signal to the beam-redirecting element to cause the beam-redirecting element to redirect the conditioned laser beam relative to the aperture to reduce or substantially eliminate the time-varying change of the line-image intensity.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary and are intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 5A) and showing two examples where the slope is positive (FIG. 5B) and negative (FIG. 5C) due to beam instability;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Cartesian coordinates are shown in some of the Figures for the sake of reference and are not intended to be limiting as to direction or orientation.

In the discussion below, certain functions such as the line-image intensity profile, the annealing temperature and the thermal emission are time-varying and are denoted $I_L(x,t)$, $T_A(x,t)$ and $E(x,t)$, respectively.

Figure 1:
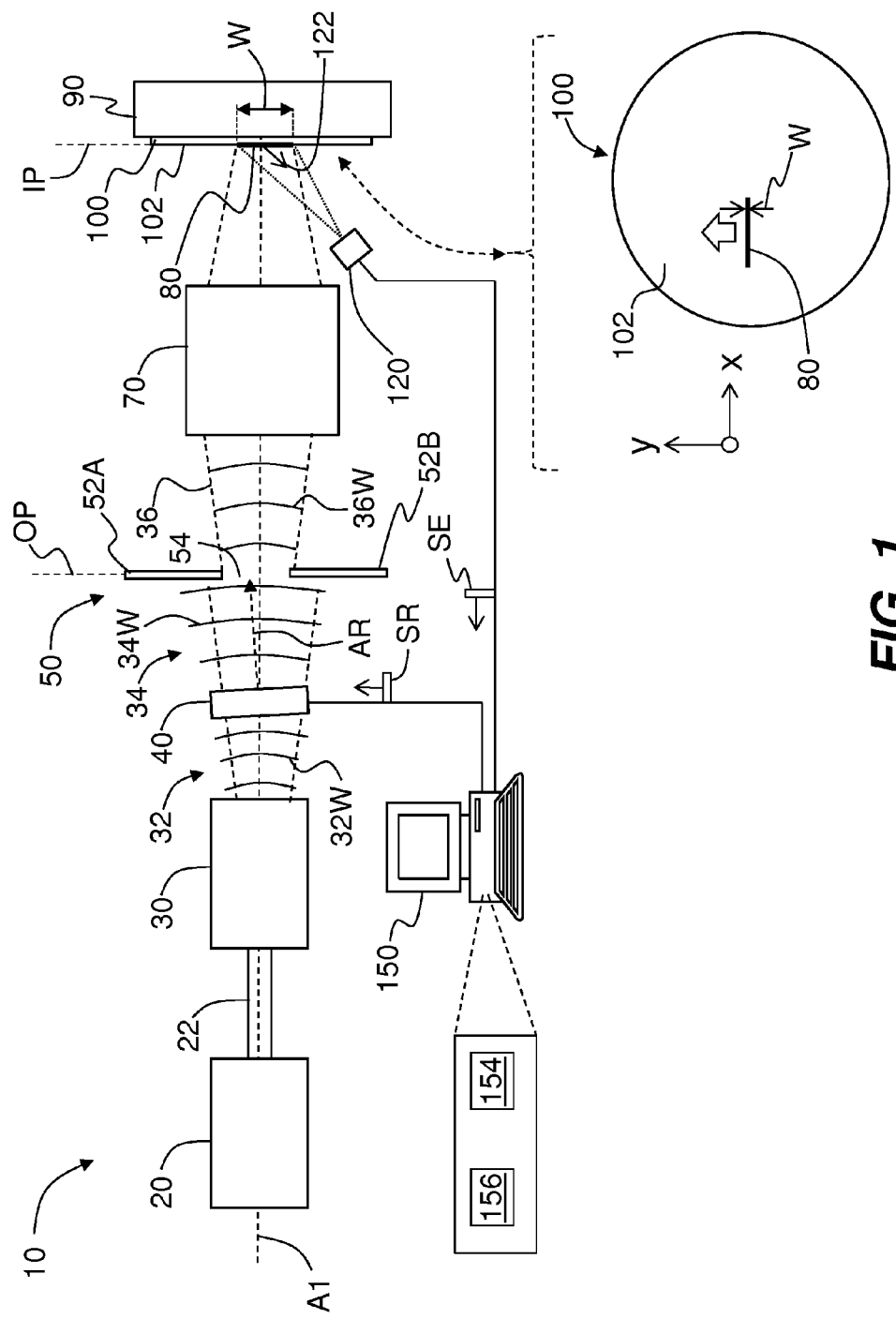
FIG. 1 is a schematic diagram of an example of a laser annealing system 10 according to the disclosure.

FIG. 1 is a schematic diagram of an example of a laser annealing system 10 according to the disclosure. The laser annealing system 10 is shown as unfolded for ease of illustration, i.e., as having a single optical axis A1. In practice, laser annealing system 10 is typically folded, as described below, to make the system compact while providing the proper beam orientations. For example, it is desirable to form the line image at an incident angle at or near the Brewster angle to minimize reflection.

The laser annealing system 10 includes a laser system 20 that emits an initial laser beam 22 along optical axis A1. In an example, laser system 20 includes an infrared (IR) laser, such as a $CO_2$ laser that emits radiation at a wavelength of nominally 10.6 μm. Other suitable lasers include mid-infrared fiber lasers, such as a thulium laser.

The laser annealing system 10 also includes a beam-conditioning system 30 arranged downstream of laser system 20 and that includes one or more beam-conditioning elements, such as an attenuator, mirrors, lenses, etc. The beam-conditioning system 30 receives initial laser beam 22 and forms therefrom a conditioned beam 32, which in an example is shown as being divergent and having wavefronts 32W. In an example, beam-conditioning optical 30 can include lenses, mirrors, apertures, filters, active optical elements (e.g., variable attenuators, etc.) and combinations thereof. Example beam-conditioning optical systems 30 are disclosed in U.S. Pat. Nos. 7,514,305, 7,494,942, 7,399,945, 6,366,308 and 8,014,427.

The laser annealing system 10 also includes a beam-redirecting element 40 arranged along axis A1 downstream of beam-conditioning system 30. The beam-redirecting element 40 is arranged to received conditioned beam 32 and redirect the beam, i.e., send the beam in a direction different from its original direction of travel, as discussed in greater detail below. The redirection is schematically illustrated by arrow AR. One example of a beam-redirecting element 40 is or includes a movable mirror, while in another example the beam-redirecting element is or includes a movable lens element. The redirected conditioned beam is denoted 34, and the redirection arrow AR indicates the direction of travel of the redirected conditioned beam.

The laser annealing system 10 further includes an aperture 50. In an example, aperture 50 includes two opposing adjustable blades 52A and 52B that define an adjustable opening 54 of width W centered on optical axis A1. Aperture 50 is thus referred to hereinafter as "knife-edge aperture" 50. The knife-edge aperture 50 serves to pass only a portion 36 of redirected conditioned beam 34. Stated differently, a portion 36W of redirected conditioned wavefronts 34W is passed by knife-edge aperture 50. In an example, blades 52A and 52B are adjustable (e.g., laterally movable) to change the size of opening 54.

The laser annealing system 10 further includes a relay system 70 that is arranged along optical axis A1 and that has an object plane OP and an image plane IP. The knife-edge aperture 50 is arranged at object plane OP. The relay system 70 receives the beam portion 36 that passes through knife-edge aperture 50 and forms a line image 80 at image plane IP. The size (length) of line image 80 is L, i.e., the size of opening 54 of knife-edge aperture 50 when relay system 70 has a magnification of 1× (i.e., is a 1:1 relay system). A typical length L of line image 80 is in the range from 5 mm to 100 mm, while a typical width W is in the range from 25 microns to 500 microns.

The laser annealing system 10 further includes a support stage 90 configured to operably support a semiconductor wafer 100 that has an upper surface 102, which resides in image plane IP. In an example, semiconductor wafer 100 is made of silicon.

The support stage 90 is movable so that line image 80 scans over wafer upper surface 102 in a direction perpendicular to its long axis (i.e., in the y-direction), as shown in the close-up inset view of semiconductor wafer 100. This direction is referred to as the "scan direction," while the perpendicular direction is referred to as the "cross-scan direction." Using the coordinate system of the close-up inset, line image 80 has an intensity $I_L(x,y)$. However, the intensity variation in the cross-scan or x-direction is the main interest, so the line-image intensity profile is denoted as $I_L(x)$. Further, as discussed below, the line-image intensity profile is time-varying and is thus denoted $I_L(x,t)$. In cases where time is taken as being constant, $I_L(x,t) \rightarrow I_L(x)$.

The laser annealing system 10 also includes a thermal emission detector 120 arranged to receive a thermal emission 122 from wafer upper surface 102 due to heating of the upper surface by line image 80. In an example, line image 80 brings the wafer upper surface 102 up to an annealing temperature $T_A$ that in an example is in the range from 800° C. to just under the silicon melt temperature of about 1,400° C. In another example, 1,100° C.$\leq T_A \leq$1,400° C., while in yet another example, 1,100° C.$\leq T_A \leq$1,300° C. In an example embodiment, thermal emission detector 120 includes a CMOS detector (e.g., a CMOS camera) having a spectral response that extends from a lower nominal wavelength $\lambda_L$=450 nm to an upper nominal wavelength $\lambda_U$=850 nm. In another embodiment, thermal emission detector 120 comprises an InGaAs detector that includes an InGaAs array having a spectral response that extends from a lower nominal wavelength $\lambda_L$=850 nm to an upper nominal wavelength $\lambda_U$=1,250 nm. The upper nominal wavelength $\lambda_U$ can be longer for doped wafers.

In an example embodiment, support stage 90 is moved so that wafer 100 moves relative to line image 80 such that the line image scans over wafer upper surface 102 but remains stationary with respect to thermal emission detector 120.

Figure 2:
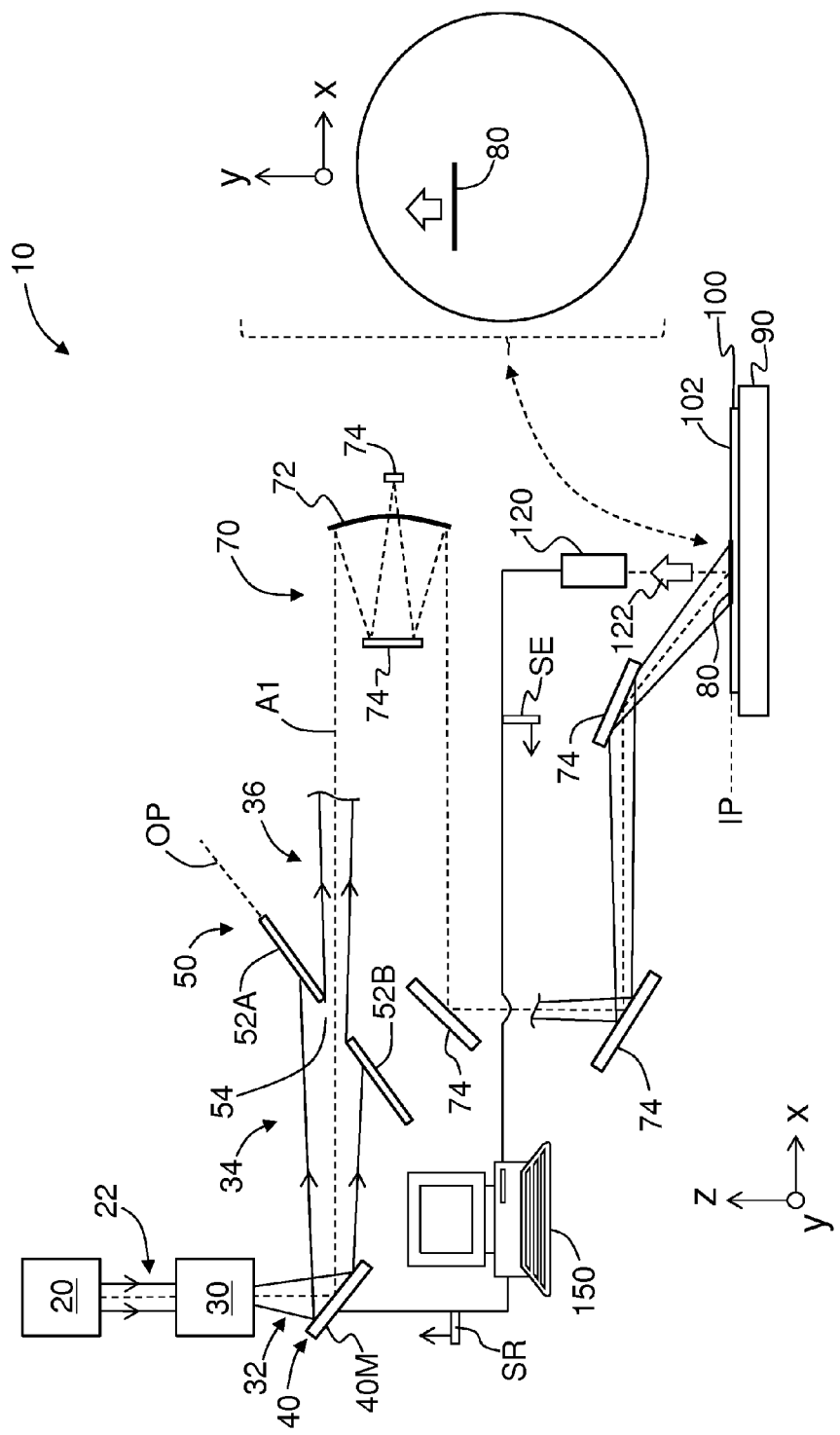
FIG. 2 is a more detailed schematic diagram of another example laser annealing system wherein the optical axis is folded by a number of fold mirrors, and the beam-redirecting element comprises a movable (rotatable) mirror.

FIG. 2 is a more detailed schematic diagram of another example laser annealing system 10 wherein optical axis A1 is folded using a number of different fold mirrors. The beam-redirecting element 40 comprises a mirror 40M that can rotate about the y-axis, so that redirected conditioned beam 34 is scanned relative to knife-edge aperture 50. The relay system 70 is shown as including a concave mirror 72 and a number of fold mirrors 74 that direct beam portion 36 to wafer surface 102 at an angle relatively to normal incidence. In an example, relay system 70 is a catoptric system, i.e., includes only mirrors.

The thermal emission detector 120 is shown as being arranged to view wafer upper surface 102 and line image 80 at normal incidence, though any angle can be used. In an example, thermal emission detector 120 is arranged so that it views wafer upper surface 102 at substantially the Brewster angle, which is the angle at which the emissivity variations are minimized. The object plane OP and knife-edge aperture 50 are shown at an angle relative to optical axis A1 since image plane IP and wafer upper surface 102 also form an angle with the optical axis.

The Thermal Emission Signal

Figure 3:
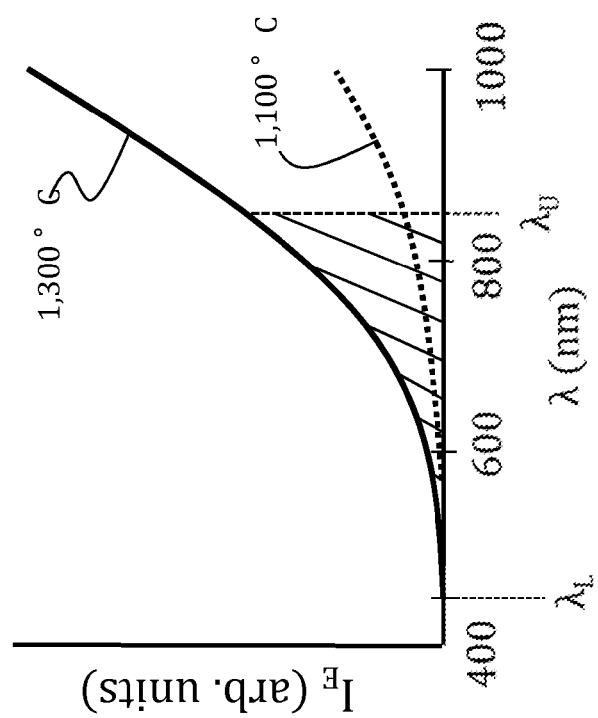
FIG. 3 is a plot of the black-body thermal emission intensity $I_E$ (arbitrary units) versus wavelength $\lambda$(nm), with the shaded area indicating the integration range of the CMOS-based thermal emission detector.

FIG. 3 is a plot of the black-body thermal emission intensity $I_E$ (arbitrary units) versus wavelength $\lambda$ (nm). The upper and lower wavelengths $\lambda_U$ and $\lambda_L$ of CMOS-based thermal emission detector 120 are shown on the horizontal axis. Two curves are shown, with the solid-line curve representing a temperature of 1,300° C. and the dotted-line curve representing a temperature of 1,100° C. The cross-hatched area represents the integrated thermal emission signal SE for the 1,300° C. curve. Other thermal emission detectors 120 can be used that view a different band of the thermal emission, i.e., have different upper and lower wavelengths $\lambda_U$ and $\lambda_L$, such as the InGaAs detector discussed above.

Figure 4:
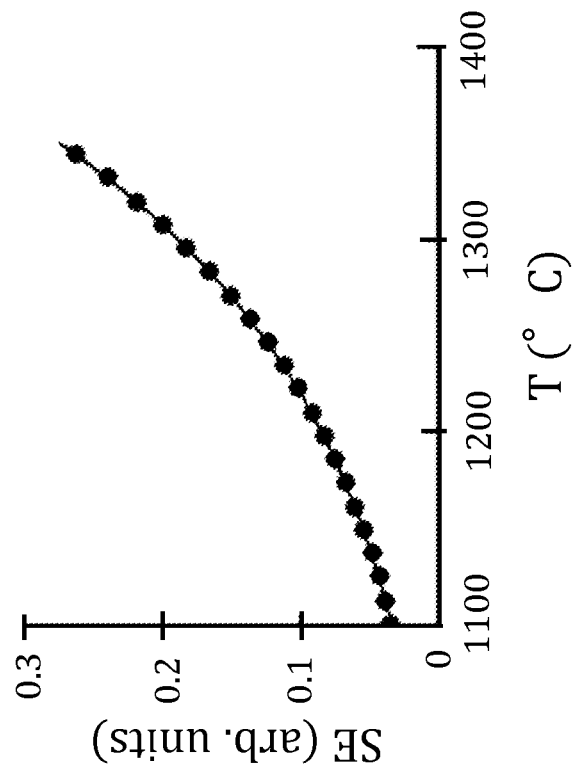
FIG. 4 is a plot of the thermal emission signal SE (arbitrary units) from the CMOS-based thermal emission detector versus temperature T (° C.), along with a fitted curve based on $T^n$ power law.

FIG. 4 is a plot of the thermal emission signal SE (arbitrary units) from the CMOS-based thermal emission detector 120 versus temperature T (° C.). The values of the thermal emission signal SE are shown as black circles, while the line through the black circles represents the best fit to the signal values. Over a typical range of annealing temperatures $T_A$ of between 800° C. and 1,300° C., the emission signal SE from CMOS-based thermal emission detector 120 fits a $T^n$ power law, with the fit to the curve in FIG. 4 yielding a value for the exponent n=11.6. When the spectral response of CMOS-based thermal emission detector 120 and the associated optics is taken into account, the value of n is closer to 13. In an example embodiment, CMOS-based thermal emission detector 120 is a band-limited detector that operates in the visible to near-IR wavelength range and that has an exponent n$\geq$10. In an example, thermal emission detector 120 comprises a photo-multiplier tube (PMT) detector.

Thus, detecting the emission signal SE, which represents an integrated measurement of the black-body power spectral density at the annealing temperature $T_A$, provides a very sensitive method of measuring the annealing temperature and its uniformity. Since the annealing temperature $T_A$ is directly proportional to the intensity $I_L(x)$ of line image 80, the emission signal SE provides for a sensitive measurement of the line-image intensity. In an example, a change in intensity of less than 1% can be detected. This is in contrast to a conventional commercial detector, which measures about a 5% change in intensity.

An example thermal emission detector 120, along with a method of calculating a measured temperature $T_M$ from the measured thermal emission E, is described in the aforementioned U.S. Patent Application Publication No. 2012/0100640.

Because the line-image intensity profile $I_L(x,t)$ is spatially varying and time-varying, the annealing temperature $T_A$ is also spatially varying and time-varying and is denoted $T_A(x,t)$ and the thermal emission E is also spatially varying and time-varying and is denoted $E(x,t)$.

The laser annealing system 10 further includes a controller 150 operably connected to beam-redirecting element 40 and thermal emission detector 120. The controller 150 receives thermal emission signal SE from and also controls the operation of beam-redirecting element 40. More particularly, thermal emission signal SE serves as a feedback signal for reducing or substantially eliminating the aforementioned time variations in the line-image intensity $I_L(x,t)$ representative of the aforementioned beam instability.

The controller 150 is programmable to perform functions described herein, and as used herein, the term "controller" broadly refers to computers, processors, microcontrollers, microcomputers, programmable logic controllers, application-specific integrated circuits and other programmable circuits. In an example, controller 150 executes instructions embodied in a computer-readable medium that cause the controller to control the movement of beam-redirecting element 40. In an example, controller 150 is configured to receive thermal emission signal SE and determine a line-image intensity $I_L(x,t)$. In an example, this determination involves first determining the annealing temperature profile $T_A(x,t)$ and then converting this profile to the line-image intensity $I_L(x,t)$ using the above-described relationships between thermal emission and temperature and intensity.

In an example, controller 150 includes an emission-to-temperature logic unit ("E/T logic") 154 electrically connected to thermal emission detector 120. The E/T logic 154 is configured to receive the measured emission signal SE, convert the measured emission E to a measured temperature $T_M$ and output a corresponding measured temperature signal $ST_M$. The measured temperature signal $ST_M$ represents an average measured temperature, as calculated from measured emission signal SE. The average is taken over a time window determined by the bandwidth of thermal emission detector 120 and measured emission signal SE.

The measured emission signal SE can include spikes due to variations in die emissivity. These spikes will show up in the measured temperature signal $ST_M$ if they are not suppressed. Consequently, in an example embodiment, E/T logic 154 is electrically connected to a low-pass filter (LPF) 156 that low-pass filters measured temperature signal $ST_M$ to form a low-pass filtered ("filtered") measured temperature signal $ST_{MF}$. In an example, LPF 156 is formed from a signal-processing device such as a field-programmable gate array (FPGA) that performs a running average or a spike suppression algorithm in addition to performing low-pass filtering. In an example, LPF 156 can be a notch filter (or E/T logic 154 can include a separate notch filter) configured to suppress pattern emissivity variations at a specific spatial/electrical frequency based on the die layout.

Beam Instability

Measured data of the magnitude M(t) of the slope of the line-image intensity profile $I_L(x,t)$ as a function of frequency f (Hz) has a general 1/f shape that is characteristic of a random fluctuation. The data show that the beam-slope magnitude drops to essentially zero for frequencies f>50 Hz.

Figure 5B:
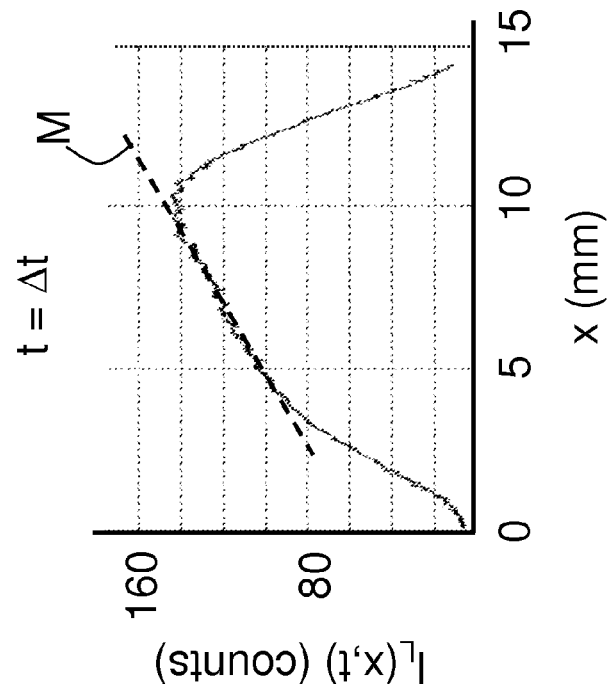
FIGS. 5A through 5C are plots of the line-image intensity profile $I_L(x,t)$ versus x (the long axis direction of the line image) at different times t, showing a normal profile with a flat top (i.e., M=0.
Figure 5A:
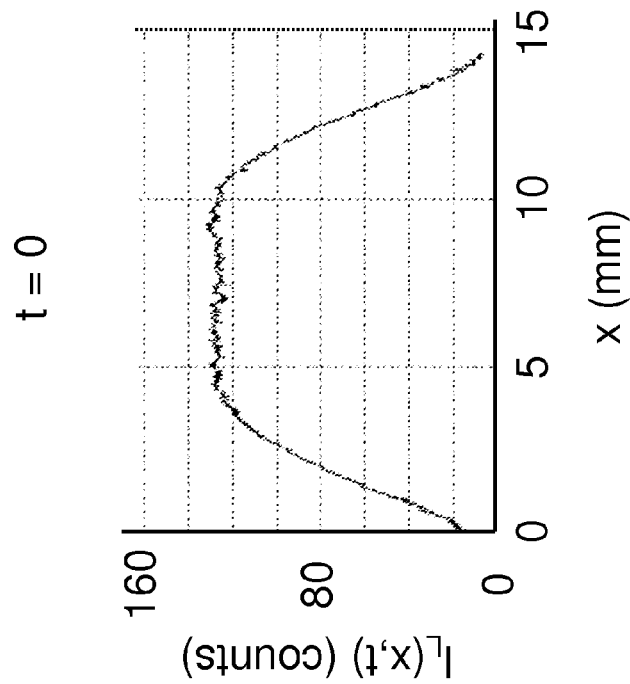
Figure 5C:
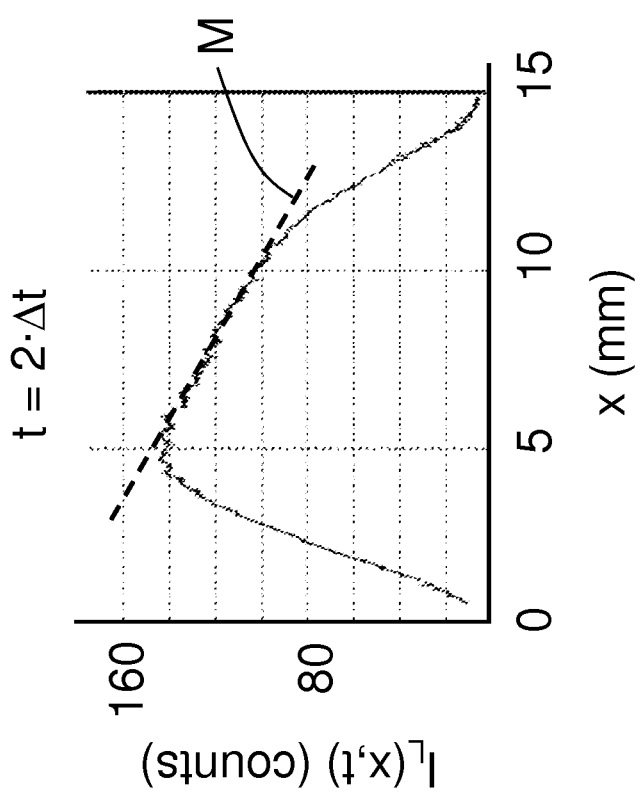

FIGS. 5A through 5C are plots of the line-image intensity $I_L(x,t)$ (detector counts) versus the distance x (mm) along the long axis of the line image 80 at different times t, such as at t=0, t=Δt and t=2·Δt. The value of Δt can be, for example, Δt=0. 2 s. FIG. 5A shows a normal example of a line-image intensity profile $I_L(x,t)$ that rises steeply at the respective ends of line image 80 and that includes a center portion of substantially uniform (flat) intensity. FIGS. 5B and 5C show examples of the line-image intensity profile $I_L(x,t)$ where the normally central flat portion of the curve has a slope, wherein one side of the line image 80 increases in intensity and the other side diminishes in intensity so that the intensity profile $I_L(x,t)$ oscillates between that shown in FIGS. 5B and 5C.

Figure 6A:
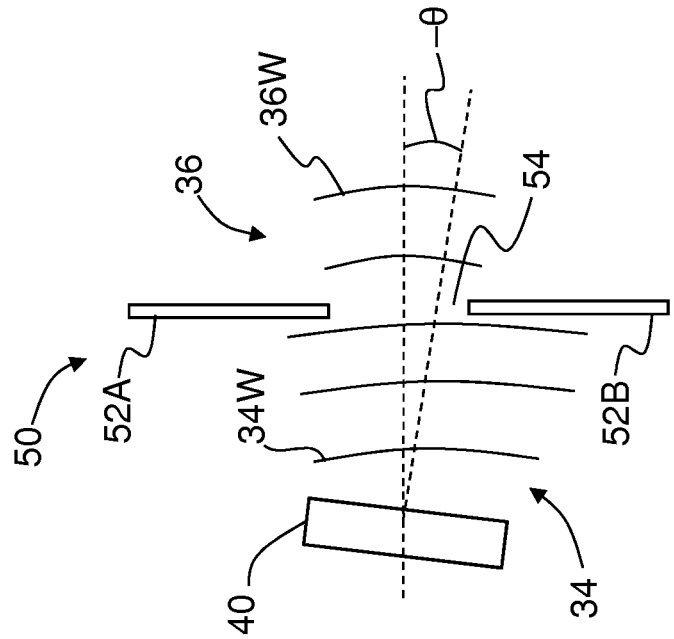
FIGS. 6A and 6B are close-up views of the beam-redirecting member of FIG. 1 shown oriented at redirection (tilt) angles of $+\theta$ and $-\theta$, respectively, and showing the different portions of the redirected and conditioned wavefronts passing through the knife-edge aperture.
Figure 6B:
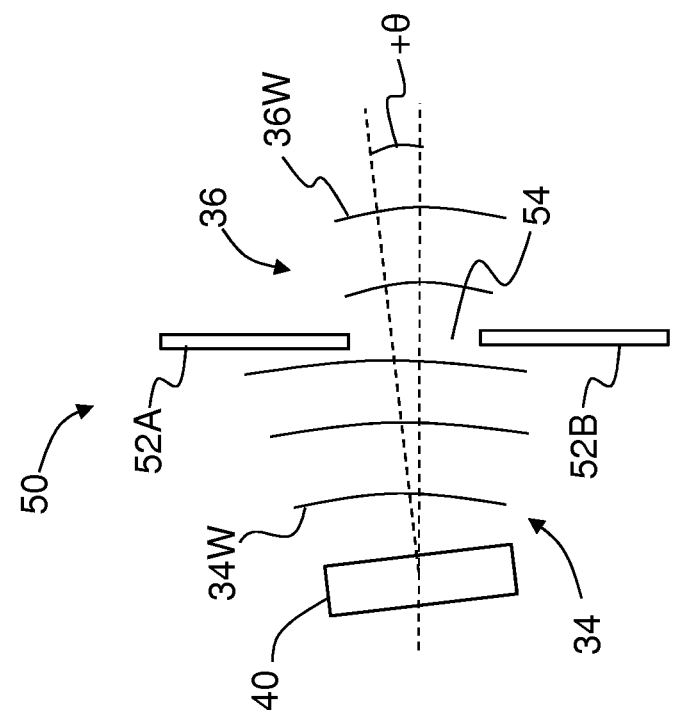

FIGS. 6A and 6B are close-up views of beam-redirecting member 40 of FIG. 1 shown as oriented at redirection (tilt) angles of +θ and −θ, respectively. The result of the different redirection angles is that different portions of redirected conditioned beam 34 pass through opening 54 of knife-edge aperture 50. In particular, as shown in FIG. 6A, redirected conditioned beam 34 is redirected upward so that the lower portion of the beam (i.e., the lower portion of wavefronts 34W) passes through opening 54. Likewise, as shown in FIG. 6B, redirected conditioned beam 34 is redirected downward so that the upper portion of the beam (i.e., the upper portion of wavefronts 34W) passes through opening 54.

Figure 7A:
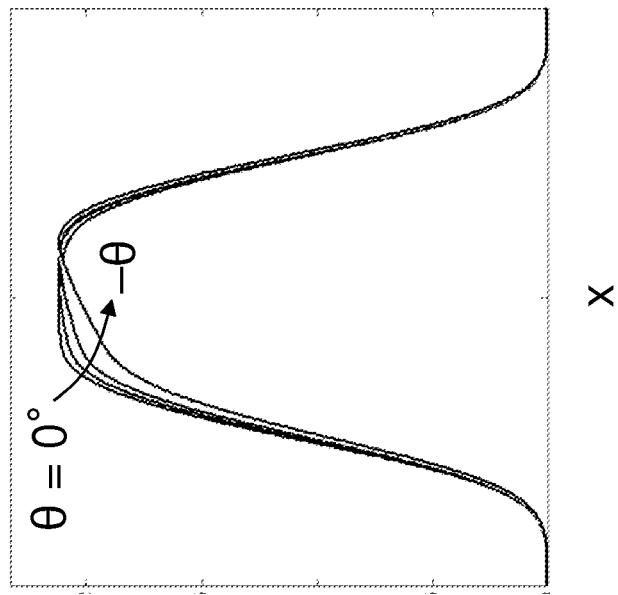
FIGS. 7A and 7B are plots of the line-image intensity profile $I_L(x)$ versus x for the beam-redirecting-mirror rotation-angle change from $\theta=0$ to $+\theta$ angles (FIG. 7A) and the beam-redirecting-mirror rotation-angle change from $\theta=0$ to $-\theta$ angles (FIG. 7B), showing how the change in rotation angle creates the same effect in the line-image intensity as in the beam instability.
Figure 7B:
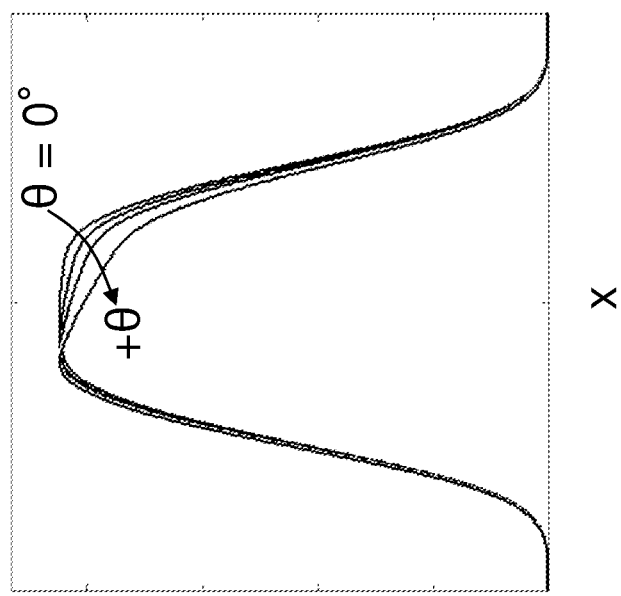

The effect of the tilt angle θ on the line-image intensity profile $I_L(x)$ is illustrated in the simulated profiles of FIGS. 7A and 7B. In FIG. 7A, the arrow shows the direction of change from θ=0° to greater positive angles +θ (i.e., increasing positive tilt), while in FIG. 7B the arrow shows the direction of change from θ=0° to greater negative angles −θ (i.e., increasing positive tilt). The required rotational angles depend strongly upon the distance between the rotating mirror and the knife edges. In a typical embodiment, the angular adjustments are less than 1 degree, and can be less than 0.1 degrees.

The two plots show that the direction of the tilt angle causes a change in the slope M of the line-image intensity profile $I_L(x)$. This characteristic is exactly what is needed to counter the adverse effects of beam instability. In particular, the tilt angle θ can be adjusted based on the measured variations in intensity of line image 80 (i.e., the measured intensity profile $I_L(x)$).

In the operation of laser annealing system 10, as discussed above laser system 20 generates laser beam 22, which is conditioned by beam-conditioning system 30 to form conditioned beam 32. The conditioned beam 32 is incident upon beam-redirecting element 40, which forms redirected conditioned beam 34, which is incident upon knife-edge aperture 50. In an example, beam-redirecting element 40 is oriented such that conditioned beam 32 is not redirected, i.e., travels straight along optical axis A1. It is assumed for the moment that beam-redirecting element 40 is not yet active so that the redirected conditioned beam 34 actually travels straight down optical axis A1 and is incident upon knife-edge aperture 50. In this situation, the center portions of wavefronts 34W pass through opening 54 of knife-edge aperture 50 to define portion 36 of redirected conditioned beam 34. The portion 36 is what gets relayed by relay system 70 to form line image 80.

As line image 80 is scanned over wafer upper surface 102, it locally heats the upper surface to the annealing temperature $T_A(x,t)$. The intensity profile $I_L(x)$ gives rise to the time-varying thermal emission profile $E(x,t)$ from the locally heated wafer upper surface 102. The (integrated) thermal emission profile $E(x,t)$ is captured by thermal emission detector 120 and is embodied in emission signal SE, which is sent to controller 150 for processing. The controller 150 uses the above-described relationship $E=T^n$ between the thermal emission and the temperature to determine an annealing temperature profile $T_A(x,t)$ to relatively high accuracy. The temperature profile $T_A(x,t)$ so obtained is then used to determine the line-image intensity profile $I_L(x,t)$.

A change in the line-image intensity profile is calculated and then beam-redirecting element 40 is adjusted to compensate for the change, i.e., to introduce an intensity variation that in turn introduces an intensity variation the counters the change. In one example, the measurement of the change in the line-image intensity profile is a slope M(t). In this case, beam-redirecting element 40 is adjusted to introduce an intensity variation that in turn introduces an intensity slope of the opposite sign to the measured slope.

Slope is perhaps the simplest change to the line-image intensity profile to measure and so is discussed herein by way of example. However, other changes can be measured that can quantify the asymmetry in the line-image intensity profile that arises due to beam instability. For example, the amount of skew or the Gaussian third moment of the line-image intensity profile can be measured.

As discussed above in connection with FIGS. 6A and 6B and FIGS. 7A and 7B, compensating for the change in the intensity profile can be accomplished in one example by providing a select angular rotation θ to mirror 40M (see FIG. 2) via a redirecting signal SR. In an example, the relationship between the amount of angle rotation θ and the induced slope M in the line-image intensity profile $I_L(x,t)$ is established using known optical modeling techniques and commercially available optical system design and modeling software. In another example, the relationship between the rotation angle θ and the induced slope M is established empirically for the given configuration of laser annealing system 10.

Using this concept, the beam profile can be stabilized as long as the feedback loop rate is sufficiently high compared to the frequency f of the change in slope M of the line-image intensity $I_L(x,t)$. In one implementation wherein the frequency f of the change in slope M of the line-image intensity $I_L(x,t)$ is within 50 Hz, the feedback control loop from thermal emission detector 120 to controller 150 to beam-deflecting element 40 can be operated with sufficient speed to reduce or substantially eliminate the adverse effects of beam instability on the uniformity of the annealing temperature $T_A(x,t)$. Example measurements of the uniformity of the laser annealing temperature $T_A(x,t)$ for laser annealing system 10 were made both with and without beam-stabilizing feedback control. Without the beam-stabilizing feedback control, the uniformity of the annealing temperature $T_A(x,t)$ was measured to be about 2.75%. With the feedback control, the annealing temperature uniformity was measured to be about 1.56%.

Thus, an aspect of the disclosure is directed to a method of reducing a time-varying change (e.g., slope M(t)) of the line-image intensity profile $I_L(x,t)$ formed during laser annealing of upper surface 102 of semiconductor wafer 100 using system 10. The method includes the following acts a) through f):

a) directing conditioned laser beam 32 to beam-redirecting element 40 so that the conditioned laser beam passes through opening 54, which defined by a knife-edge aperture blades 52A and 52B;

b) forming line image 80 on wafer upper surface 102 by imaging knife-edge aperture 50 on the wafer upper surface, thereby locally heating the surface to form time-varying annealing temperature distribution $T_A(x,t)$;

c) detecting a time-varying integrated thermal emission E(x,t) over a wavelength band (e.g., from about $\lambda_L$=450 nm to about $\lambda_U$=850 nm for CMOS detectors or from about $\lambda_L$=900 to about $\lambda_U$=1,200 nm for InGaAs detectors) from the locally heated wafer surface;

d) determining the time-varying annealing temperature distribution $T_A(x,t)$ from the detected time-varying integrated thermal emission E(x,t);

e) determining from the time-varying annealing temperature distribution $T_A(x,t)$ the time-varying change (e.g., the slope M(t)) of the line-image intensity profile $I_L(x,t)$; and f) adjusting beam-redirecting element 40 at a frequency f≥$f_{max}$ to redirect conditioned beam 32 relative to opening 54 in knife-edge aperture 50 to reduce or eliminate the time-varying change (slope M(t)) of the time-varying line-image intensity profile I(x,t). Here, $f_{max}$ is the maximum frequency observed in the Fourier spectrum of the beam slope variation. In an example, f≥10·$f_{max}$. Thus, in one example, the adjusting of beam-redirecting element 40 is carried out at a frequency f of up to 500 Hz.

In an example embodiment of the method, acts d) and e) as described above are carried out in controller 150, which includes instructions embodied in a computer-readable medium (e.g., software) that cause the controller to calculate the time-varying annealing temperature distribution $T_A(x,t)$ and the time-varying slope M(t) of the line-image intensity profile $I_L(x,t)$, wherein the controller sends control signal SR to beam-redirecting element 40 to initiate act f) relating to the adjusting of the beam-redirecting element.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of forming a line image during laser annealing of a surface of a semiconductor wafer, comprising:
   directing a conditioned laser beam in a first direction through an opening in an aperture using a beam-redirecting element;
   forming a line image on the surface of the semiconductor wafer by imaging the aperture onto the surface using the conditioned laser beam, thereby locally heating the surface to form an annealing temperature distribution;
   detecting thermal emissions from the locally heated wafer surface;
   determining the annealing temperature distribution from the detected thermal emissions;
   determining from the annealing temperature distribution a line-image intensity profile that includes a time-varying amount of slope; and
   adjusting the beam-redirecting element to redirect the conditioned laser beam to travel in a second direction through the opening in the aperture to reduce or eliminate the time-varying amount of slope in the line-image intensity profile.

2. The method according to claim 1, wherein the adjusting of the beam-redirecting element includes rotating a mirror.

3. The method according to claim 1, wherein detecting the thermal emissions includes capturing the thermal emission with either a CMOS detector, an InGaAs detector or a photomultiplier tube.

4. The method according to claim 1, wherein the captured thermal emissions comprise an integrated measurement of a black-body emission intensity over a wavelength range from a lower wavelength $\lambda_L$ =450 nm to an upper wavelength $\lambda_u$ =850 nm.

5. The method according to claim 1, wherein the captured thermal emissions comprise an integrated measurement of a black-body emission intensity over a wavelength range from a lower wavelength $\lambda_L = 900$ nm to an upper wavelength $\lambda_u = 1,200$ nm.

6. The method according claim 1, wherein the annealing temperature distribution includes an annealing temperature $T_A$ in the range from 800° C. $T_A$ 1,400° C.

7. The method according to claim 1, wherein the semiconductor wafer is made of silicon.

8. The method according to claim 1, wherein the conditioned laser beam has a wavelength of either 10.6 microns or 2 microns.

9. The method according to claim 1, wherein the aperture is a knife-edge aperture, and wherein imaging the aperture onto the surface includes imaging the knife-edge aperture with a 1:1 relay system.

10. The method according to claim 1, wherein detecting the thermal emissions is performed using a thermal emission detector operably arranged relative to the wafer surface, and further comprising moving the wafer relative to the line image so that the line image scans over the wafer surface but remains stationary with respect to the thermal emission detector.

11. The method according to claim 1, wherein the adjusting of the beam-directing element is performed at a frequency of up to 500 Hz.

12. A method of reducing a time-varying change of an intensity profile of a line image formed during laser annealing of a surface of a semiconductor wafer, comprising:
a) directing a conditioned laser beam to a beam-redirecting element so that the conditioned laser beam passes in a first direction through an opening defined by an aperture;
b) forming a line image on the surface of the semiconductor wafer by imaging the aperture on the wafer surface using the conditioned laser beam, thereby locally heating the surface to form a time-varying annealing temperature distribution;
c) detecting a time-varying integrated thermal emissions over a wavelength band from the locally heated wafer surface;
d) determining the time-varying annealing temperature distribution from the detected time-varying integrated thermal emissions;
e) determining from the time-varying annealing temperature distribution the time-varying change in the line-image intensity profile; and
f) adjusting a beam-redirecting element to redirect the conditioned laser beam to travel in a second direction relative to the opening in the aperture to reduce or eliminate the time-varying change of the line-image intensity profile.

13. The method according to claim 12, wherein:
acts d) and e) are carried out in a controller that includes instructions embodied in a non-transitory computer-readable medium that cause the controller to calculate the time-varying annealing temperature distribution and the time-varying change of the line-image intensity profile; and
wherein the controller sends a control signal to the beam-redirecting element to initiate act f).

14. The method according to claim 13, wherein the beam-redirecting element comprises a mirror, and wherein said adjusting of the beam-redirecting element comprises rotating the mirror over a range of rotation angles θ between +/−1 degree.

15. The method according to claim 12, wherein the time-varying change includes a time-varying slope of the line-image intensity profile.

16. The method according to claim 12, wherein the aperture is defined by opposing adjustable knife edges.

17. A method of forming a line image during laser annealing of a surface of a semiconductor wafer, comprising:
directing a conditioned laser beam in a first direction through an opening in an aperture;
forming a line image on the surface of the semiconductor wafer by imaging the aperture onto the surface using the conditioned laser beam, thereby locally heating the surface to form an annealing temperature distribution;
detecting thermal emissions from the locally heated wafer surface;
determining the annealing temperature distribution from the detected thermal emissions;
determining from the annealing temperature distribution a line-image intensity profile that includes a time-varying amount of change; and
redirecting the conditioned laser beam to travel in a second direction through the opening in the aperture to reduce or eliminate the time-varying amount of change in the line-image intensity profile.

18. The method according to claim 17, wherein the acts of directing and re-directing are performed using a beam-redirecting element.

19. The method according to claim 18, wherein the beam-redirecting element comprises either a movable mirror or a movable lens element.

20. The method according to claim 17, wherein the aperture comprises a knife-edge aperture.

21. The method according to claim 20, wherein the act of imaging the aperture onto the surface includes imaging the knife-edge aperture with a relay system.

22. The method according to claim 21, wherein the relay system has a magnification of 1x.

23. The method according to claim 17, wherein the time-varying amount of change in the line-image intensity profile is measured using one of a slope, a skew or a Gaussian third moment.

* * * * *

UNITED STATES PATENT AND TRADEMARK OFFICE
CERTIFICATE OF CORRECTION

PATENT NO. : 9,559,023 B2
APPLICATION NO. : 14/311747
DATED : January 31, 2017
INVENTOR(S) : McWhirter et al.

Page 1 of 1

It is certified that error appears in the above-identified patent and that said Letters Patent is hereby corrected as shown below:

In the Claims

In Column 10, Line 61, after the word "claim" delete the number "1" and insert the number --3-- therefor.

In Column 10, Line 66, after the word "claim" delete the number "1" and insert the number --3-- therefor.

In Column 11, Line 24, delete the wording "-directing" insert the wording -- -redirecting--.

Signed and Sealed this
Twenty-eighth Day of July, 2020

Andrei Iancu
*Director of the United States Patent and Trademark Office*